US010852628B2

(12) United States Patent
Nakamura et al.

(10) Patent No.: US 10,852,628 B2
(45) Date of Patent: Dec. 1, 2020

(54) PROJECTOR

(71) Applicant: SEIKO EPSON CORPORATION, Tokyo (JP)

(72) Inventors: Kentaro Nakamura, Shiojiri (JP); Kaname Nagatani, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/564,104

(22) PCT Filed: Apr. 7, 2016

(86) PCT No.: PCT/JP2016/001940
§ 371 (c)(1),
(2) Date: Oct. 3, 2017

(87) PCT Pub. No.: WO2016/163124
PCT Pub. Date: Oct. 13, 2016

(65) Prior Publication Data
US 2018/0081262 A1    Mar. 22, 2018

(30) Foreign Application Priority Data

Apr. 8, 2015    (JP) ................. 2015-079498

(51) Int. Cl.
G03B 21/16    (2006.01)
H05K 7/20    (2006.01)
(Continued)

(52) U.S. Cl.
CPC .............. *G03B 21/16* (2013.01); *F25B 21/02* (2013.01); *F25B 21/04* (2013.01); *F25D 17/02* (2013.01);
(Continued)

(58) Field of Classification Search
CPC .. F25B 21/02; F25B 9/00; F25B 9/002; F25B 9/004; F25B 9/006; F25B 9/008;
(Continued)

(56) References Cited

U.S. PATENT DOCUMENTS

2005/0018151 A1*    1/2005    Kitabayashi ....... G02B 27/1013
353/119
2007/0291238 A1    12/2007    Yanagisawa et al.
(Continued)

FOREIGN PATENT DOCUMENTS

JP    2005-121250 A    5/2005
JP    2007-334043 A    12/2007
(Continued)

OTHER PUBLICATIONS

Jun. 14, 2016 International Search Report issued in International Patent Application No. PCT/JP2016/001940.
(Continued)

*Primary Examiner* — Michelle M Iacoletti
*Assistant Examiner* — Christopher A Lamb, II
(74) *Attorney, Agent, or Firm* — Oliff PLC

(57) ABSTRACT

A projector includes a first circulation channel formed in a sealed space and where a first fluid for cooling a cooling target arranged within the sealed space circulates, a second circulation channel where a second fluid to which heat is conducted from the first fluid circulates, and a third circulation channel where a third fluid to which heat is conducted from the second fluid circulates and where the heat conducted to the third fluid is radiated in a process of circulation of the third fluid. The first fluid is gas. The second fluid and the third fluid are liquid.

11 Claims, 8 Drawing Sheets

(51) Int. Cl.
| | |
|---|---|
| G03B 21/00 | (2006.01) |
| H04N 5/74 | (2006.01) |
| F25D 17/06 | (2006.01) |
| F25D 17/02 | (2006.01) |
| F25B 21/02 | (2006.01) |
| F25B 21/04 | (2006.01) |
| F28D 7/00 | (2006.01) |
| F28F 9/26 | (2006.01) |
| G03B 21/14 | (2006.01) |

(52) U.S. Cl.
CPC .......... *F25D 17/06* (2013.01); *F28D 7/0066* (2013.01); *F28F 9/26* (2013.01); *G03B 21/00* (2013.01); *G03B 21/145* (2013.01); *H04N 5/74* (2013.01); *H05K 7/20* (2013.01); *G03B 21/006* (2013.01)

(58) Field of Classification Search
CPC .... G03B 21/006; G03B 21/16; G03B 21/145; G03B 21/00–64; F28F 9/26; F28D 7/0066; F28D 7/0075; F28D 7/0083; F28D 7/0091; F28D 7/00–7/1692; H04N 9/3144; H04N 9/00–3197; F25D 17/00–08; F25D 7/00–1692
See application file for complete search history.

(56) References Cited

U.S. PATENT DOCUMENTS

| | | | |
|---|---|---|---|
| 2008/0055563 A1 | 3/2008 | Momose et al. | |
| 2009/0237619 A1 | 9/2009 | Yanagisawa et al. | |
| 2010/0077772 A1* | 4/2010 | Shin | F25B 5/00 62/56 |
| 2010/0118279 A1* | 5/2010 | Itsuki | G03B 21/16 353/54 |
| 2010/0245779 A1 | 9/2010 | Yanagisawa et al. | |
| 2010/0302463 A1* | 12/2010 | Matsumoto | G03B 21/16 348/744 |
| 2011/0019160 A1* | 1/2011 | Kitano | G03B 21/16 353/57 |
| 2011/0304829 A1* | 12/2011 | Enomoto | H04N 9/3129 353/31 |
| 2015/0107272 A1* | 4/2015 | Tachibana | F25B 21/02 62/3.6 |
| 2015/0156466 A1* | 6/2015 | Nagatsu | H04N 9/3144 353/54 |

FOREIGN PATENT DOCUMENTS

| | | |
|---|---|---|
| JP | 2009-75236 A | 4/2009 |
| JP | 4265632 B2 | 5/2009 |
| JP | 2009-133988 A | 6/2009 |
| JP | 2010-48885 A | 3/2010 |
| JP | 2010-224440 A | 10/2010 |
| WO | 2013/157417 A1 | 10/2013 |

OTHER PUBLICATIONS

Oct. 9, 2018 Search Report issued in European Patent Application No. 16776295.4.

* cited by examiner

PROJECTOR

TECHNICAL FIELD

The present invention relates to a projector.

BACKGROUND ART

Traditionally, a projector is known which has a light source, a light modulator which modulates light emitted from the light source and forms an image corresponding to image information, and a projection device which projects the formed image in an enlarged form on a projection surface such as a screen. As such a projector, a configuration having a sealed circulating air-cooling unit which cools optical devices (including a liquid crystal panel as a light modulator) each of which is arranged within a sealed structure and a polarization conversion element with air circulating inside the sealed structure, is proposed (see, for example, PTL 1).

In the projector disclosed in PTL 1, the sealed circulating air-cooling unit has a first air-cooling unit which circulates air in a first air flow channel within a first sealed structure and thus cools the optical devices, and a second air-cooling unit which circulates air in a second air flow channel within a second sealed structure and thus cools the polarization conversion element.

The first air-cooling unit has a heat exchanger and a circulation fan, a duct member which forms the first sealed structure with an optical component casing, and a first heat radiator. Of these, the heat exchanger is a device which receives the heat of the air following the first air flow channel inside the first sealed structure and radiates the heat outward. The heat exchanger has a structure in which a thermally conductive member on the heat receiving side faces inside the first sealed structure and in which a thermally conductive member on the heat radiating side cooled with air sent by a cooling fan faces outside the first sealed structure. Also, the first heat radiator has a first heat receiving member which is connected to a high-thermal-conductive duct part of the duct member and receives the heat of the air circulated, a first heat radiation member to which air is sent from the cooling fan, and a first heat conducting member formed by a heat pipe which is connected to the first heat receiving member at one end and connected to the first heat radiation member at the other end. Then, in the first air-cooling unit, the air in the first air flow channel, which is annular, is circulated by the circulation fan, and the optical devices inside the duct member are thus cooled.

The second air-cooling unit has a circulation fan, a duct member, and a second heat radiator. Of these, the second heat radiator has a second heat receiving member which directly receives the heat of the air following the second air flow channel, which is annular, and a second heat conducting member which guides the heat conducted to the second heat receiving member and the high-thermal-conductive duct part, from inside the second sealed structure to outside and conducts the heat to the first heat radiation member. Then, the air in the annular second air flow channel is circulated by the circulation fan and the polarization conversion element inside the duct member is thus cooled.

CITATION LIST

Patent Literature

PTL 1: Japanese Patent No. 4265632

SUMMARY OF INVENTION

Technical Problem

The projector disclosed in the foregoing PTL 1 has a configuration in which the heat of air circulating within the circulation channels is radiated outward by the heat conducting member formed by a heat pipe and the heat radiation member formed by a seat sink. Such a configuration has a problem that, with the heat pipe alone, it is difficult to efficiently conduct the heat inside the sealed structures when the amount of heat of a cooling target is increased. Also, because of this, a large heat receiving member and heat radiation member need to be used. Therefore, the degree of freedom in the arrangement of the configurations on the heat absorbing side and the heat radiating side is reduced, and the degree of freedom in the arrangement is reduced due to the use of the heat pipe.

In view of such problems, a configuration which enables efficient cooling of a cooling target and hence improvement in the degree of freedom in the arrangement of the cooling structure has been desired.

An object of the invention is to solve at least a part of the foregoing problems and to provide a projector in which a cooling target can be cooled efficiently.

Solution to Problem

A projector according to an aspect of the invention includes: a first circulation channel formed in a sealed space and where a first fluid for cooling a cooling target arranged within the sealed space circulates; a second circulation channel where a second fluid to which heat is conducted from the first fluid circulates; and a third circulation channel where a third fluid to which heat is conducted from the second fluid circulates and where the heat conducted to the third fluid is radiated in a process of circulation of the third fluid. The first fluid is gas. The second fluid and the third fluid are liquid.

According to the foregoing aspect, the heat is conducted to the second fluid, which is the liquid circulating through the second circulation channel, from the first fluid, which is the gas within the sealed space. The heat of the second fluid is conducted to and radiated from the third fluid, which is the liquid circulating through the third circulation channel.

Thus, since at least a part of the second circulation channel where the second fluid circulates is arranged within the sealed space, the heat from the first fluid in the sealed space can be conducted to the second fluid. Therefore, at a site situated outside the sealed space of the second circulation channel, the heat of the second fluid can be conducted to and radiated from the third fluid circulating through the third circulation channel situated outside the sealed space. Thus, compared with a configuration in which a large heat pipe is arranged to communicate the inside and outside of the sealed space, the heat of the first fluid can be conducted effectively to the third fluid via the second fluid and therefore the cooling target inside the sealed space can be cooled effectively.

Also, since a part of the second circulation channel and the third circulation channel can be arranged, spaced apart from the sealed space, the degree of freedom in the installation of these inside the projector can be improved. Thus, compared with the foregoing configuration, in which a large heat pipe must be arranged near the sealed space, the degree of freedom in the arrangement of the members forming the second circulation channel and the third circulation channel can be improved.

In the foregoing aspect, it is preferable that the projector has a heat exchanger connected to the second circulation channel and the third circulation channel and configured to conduct the heat of the second fluid circulating through the second circulation channel to the third fluid circulating through the third circulation channel, and that the heat exchanger includes a heat receiving section configured to receive heat from the second fluid circulating inside, a heat radiation section configured to radiate the heat conducted from the heat receiving section to the third fluid circulating inside, and a thermoelectric conversion element which has a heat absorption surface connected to the heat receiving section in a thermally conductive manner and which has a heat radiation surface connected to the heat radiation section in a thermally conductive manner.

According to the foregoing aspect, the thermoelectric conversion element absorbs the heat of the second fluid whose heat is received by the heat receiving section, and conducts the heat to the heat radiation section in which the third fluid circulates. Therefore, the heat of the second fluid can be conducted efficiently to the third fluid. Thus, since the second fluid can be cooled, the first fluid inside the sealed space can be cooled and therefore the cooling target can be cooled efficiently.

In the foregoing aspect, it is preferable that the second circulation channel includes a second circulation channel-side pump configured to pump the second fluid, a heat absorber arranged inside the sealed space and configured to conduct the heat absorbed from the first fluid to the second fluid circulating inside, a second circulation channel-side tank configured to store the second fluid, and a plurality of second circulation channel-side flow tubes configured to connect the second circulation channel-side pump, the heat absorber, the second circulation cannel-side tank and the heat exchanger, and that the second fluid pumped by the second circulation channel-side pump flows in order through the heat exchanger, the heat absorber and the second circulation channel-side tank, subsequently flows into the second circulation channel-side pump, and thus circulates through the second circulation channel.

According to the foregoing aspect, when the second circulation channel-side pump is driven, the second fluid cooled at the heat exchanger flows to the heat absorber via the second circulation channel-side flow tubes. Thus, the second fluid in the state of the lowest temperature in the second circulation channel can be made to flow to the heat absorber inside the sealed space. Therefore, since the cooling of the first fluid by heat exchange at the heat absorber can be carried out effectively, the first fluid with a low temperature can be made to flow to the cooling target and the cooling target can be cooled effectively.

In the foregoing aspect, it is preferable that the second circulation channel includes a second circulation channel-side heat radiator configured to radiate the heat of the second fluid flowing inside.

According to the foregoing aspect, since the second fluid can be cooled by the second circulation channel-side heat radiator, the temperature of the second fluid can be lowered further. Therefore, the first fluid can be cooled more effectively and hence the cooling target can be cooled more effectively.

In the foregoing aspect, it is preferable that the third circulation channel includes a third circulation channel-side pump configured to pump the third fluid, a heat radiator configured to radiate the heat of the third fluid flowing inside, a third circulation channel-side tank configured to store the third fluid, and a plurality of third circulation channel-side flow tubes configured to connect the third circulation channel-side pump, the heat radiator, the third circulation channel-tank and the heat exchanger, and that the third fluid pumped by the third circulation channel-side pump flows in order through the heat radiation section, the heat exchanger and the third circulation channel-side tank, subsequently flows into the third circulation channel-side pump, and thus circulates through the third circulation channel.

According to the foregoing aspect, when the third circulation channel-side pump is driven, the third fluid whose heat is radiated by the heat radiator is made to flow to the heat exchanger via the third circulation channel-side flow tube. Thus, the third fluid in the state of the lowest temperature in the third circulation channel can be made to flow to the heat exchanger. Therefore, it can be made easier to conduct the heat from the second fluid to the third fluid. Thus, since the second fluid can be cooled further, the first fluid and hence the cooling target can be cooled more effectively.

In the foregoing aspect, it is preferable that the projector has a circulation fan arranged inside the sealed space and configured to circulate the first fluid.

According to the foregoing aspect, the first fluid inside the sealed casing can be securely circulated by the circulation fan. Therefore, the first fluid can be securely made to flow to the cooling target inside the sealed casing and the cooling target can be cooled securely.

In the foregoing aspect, it is preferable that the projector includes: a sealed casing which includes the sealed space inside and a cooling fan disposed outside the sealed casing and configured to send cooling air, that the sealed casing includes a heat radiation member configured to radiate heat inside the sealed casing to outside, and that the cooling fan is configured to flow the cooling air to the heat radiation member.

According to the foregoing aspect, the heat radiation member, which radiates the heat inside the sealed casing to outside, is provided, and the cooling air is made to flow to the heat radiation member by the cooling fan. Thus, a path where the temperature of the first fluid inside the sealed space is lowered can be provided separately from the second circulation channel and the third circulation channel. Therefore, the temperature of the first fluid can be lowered further and the cooling target can be cooled effectively.

In the foregoing aspect, it is preferable that the projector includes: a light source; a light modulator configured to modulate light emitted from the light source and form an image; and an optical component arranged on an optical path of the light emitted from the light source and configured to contribute to image formation by the light modulator, that the optical component includes a field lens, and that the field lens and the sealed casing constitute the sealed space.

According to the foregoing aspect, a member separating the sealed space and another space (for example, the space inside an optical component casing where an optical component is arranged) can be omitted. Therefore, the number of components can be reduced and the sealed casing and hence the projector can be reduced in size.

In the foregoing aspect, it is preferable that the projector includes: a light source; a light modulator configured to modulate light emitted from the light source and form an image; and an optical component arranged on an optical path of the light emitted from the light source and configured to contribute to image formation by the light modulator, and that the cooling target is at least one of the light source, the light modulator and the optical component.

According to the foregoing aspect, the cooling target is at least one of the light source, the light modulator and the optical component. Thus, as the cooling target can be cooled effectively, image projection can be carried out stably and deterioration of the cooling target and deterioration of the projected image can be restrained.

DESCRIPTION OF EMBODIMENTS

First Embodiment

Figure 1:
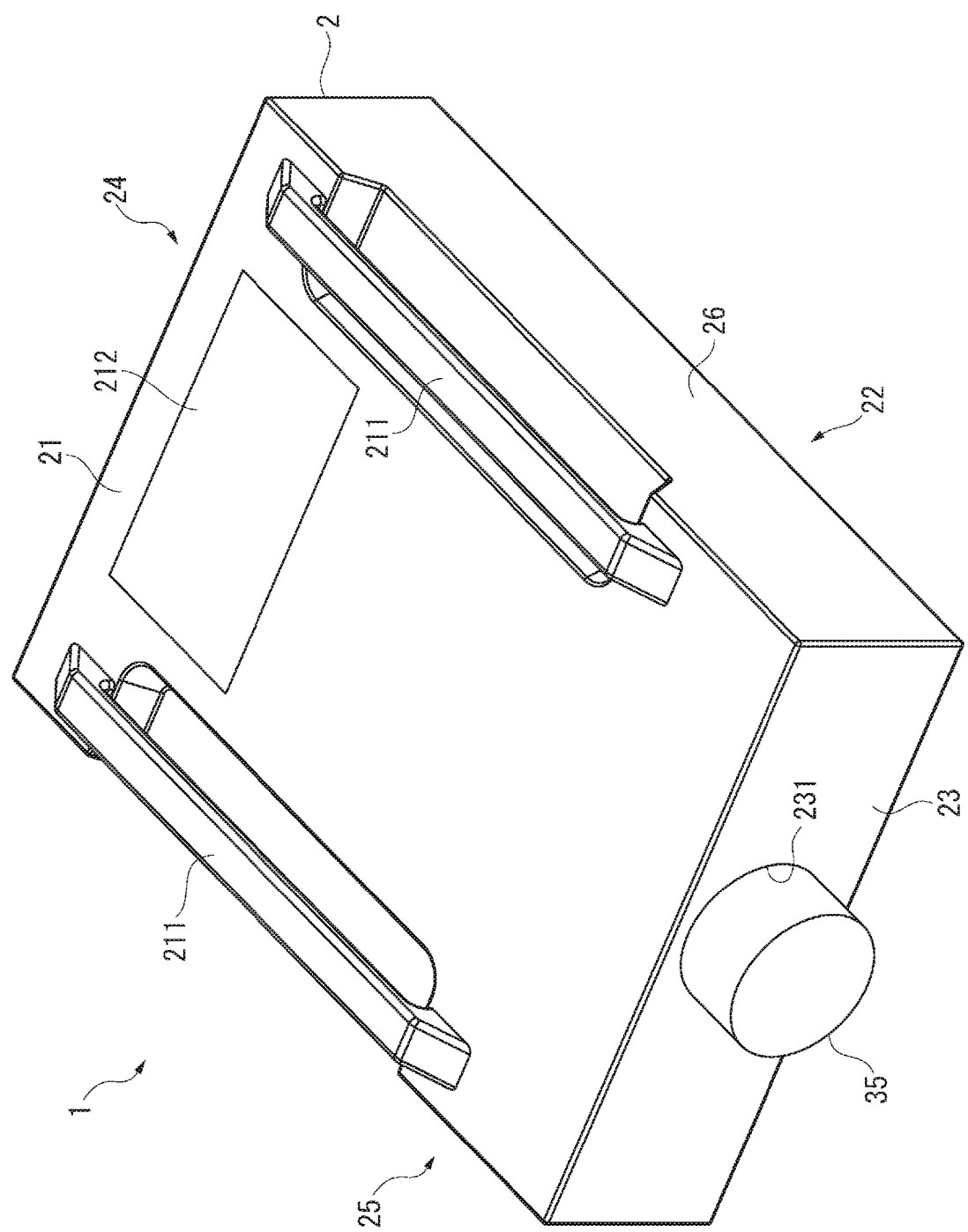
FIG. 1 is a schematic perspective view showing a projector according to a first embodiment of the invention.

Hereinafter, a first embodiment of the invention will be described, based on the drawings.
[Exterior Configuration of Projector]
FIG. 1 is a schematic perspective view showing a projector 1 according to this embodiment.

The projector 1 according to this embodiment is a projection-type display device which modulates light emitted from an illumination device 31, described later, thus forms an image corresponding to image information, and projects the image in an enlarged form on a projection surface such as a screen.

This projector 1, as will be described in detail later, has the function of circulating cooling air in a sealed casing where a cooling target is arranged, thus cooling the cooling target, conducting the heat of the cooling air heated by the cooling of the cooling target to a second liquid via a first liquid circulating inside and outside the sealed casing, radiating the heat of the second liquid in a process of circulating the second liquid outside the sealed casing, and thus radiating the heat of the cooling target in the sealed casing to the outside of the sealed casing.

This projector 1 has an exterior casing 2 forming its exterior, as shown in FIG. 1.

The exterior casing 2 is formed substantially in the shape of a rectangular parallelepiped having a top surface section 21, a bottom surface section 22, a front surface section 23, a back surface section 24, and left and right lateral surface sections 25, 26.

The top surface section 21 is provided with a pair of handles 211 used by the user when grasping the projector 1 or when fixing the projector 1 to a tool installed on the ceiling or the like. Also, an opening (not illustrated) for housing light sources 31A, 31B, described later, in the exterior casing 2 in a replaceable manner is formed in the top surface section 21. This opening is covered with a cover member 212.

The bottom surface section 22 is provided with a leg part which, when the projector is installed on an installation surface of an installable table or the like, comes in contact with the installation surface, though not illustrated.

In the front surface section 23, an opening 231 is formed through which a part of a projection device 35 forming an image forming device 3, described later, is exposed.

Figure 2:
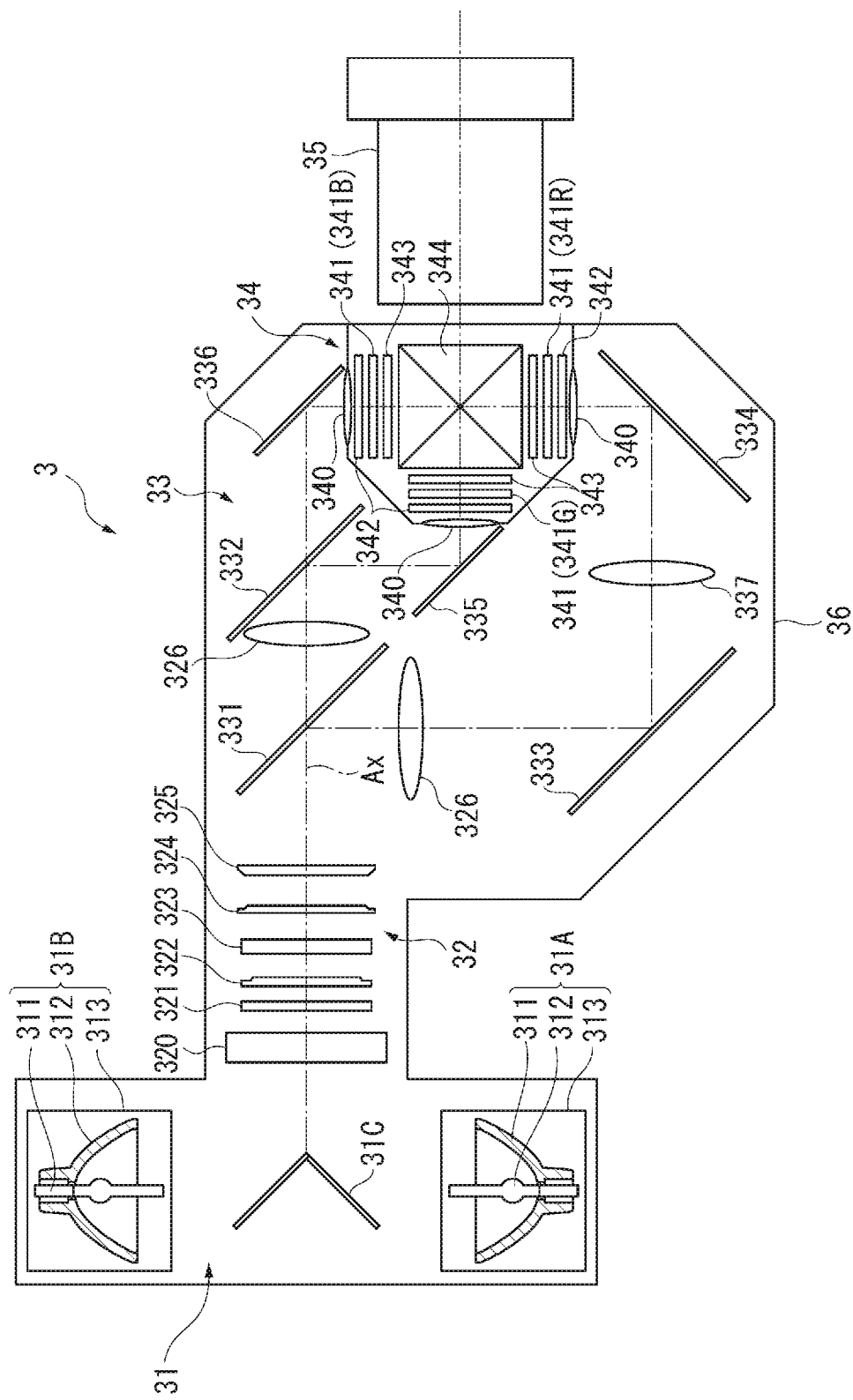
FIG. 2 is a schematic view showing a configuration of an image forming device in the first embodiment.

In addition to these, an inlet port through which the air outside the exterior casing 2 is introduced inside is formed in the right lateral surface section 26, and a discharge port through which the air inside the exterior casing 2 is discharged outside is formed in the left lateral surface section 25, though not illustrated.
[Internal Configuration of Projector]
FIG. 2 is a schematic view showing the configuration of the image forming device 3.

The projector 1 has the image forming device 3 arranged inside the exterior casing 2, as shown in FIG. 2, in addition to the exterior casing 2. Moreover, though not illustrated, the projector 1 has a control device which controls the projector 1, and a power supply device which supplies electricity to electronic components forming the projector 1.
[Configuration of Image Forming Device]
The image forming device 3 forms and projects an image corresponding to image information inputted from the control device. This image forming device 3 has an illumination device 31, an equalizing device 32, a color separation device 33, an electro-optical device 34, a projection device 35, and an optical component casing 36.

Of these, the optical component casing 36 is a box-like casing with an illumination optical axis Ax set inside. The illumination device 31, the equalizing device 32, the color separation device 33 and the electro-optical device 34 are arranged at positions on the illumination optical axis Ax inside the optical component casing 36. Meanwhile, the projection device 35 is situated outside the optical component casing 36 but is arranged according to the illumination optical axis Ax.

The illumination device 31 has a pair of light sources 31A, 31B arranged opposite each other, and a reflection mirror 31C arranged between the pair of light sources 31A, 31B.

Each of the pair of light sources 31A, 31B has a light source lamp 311 and a reflector 312, and a housing body 313 housing these inside. These light sources 31A, 31B emit light toward the reflection mirror 31C.

The reflection mirror 31C reflects the light which becomes incident from the light sources 31A, 31B, into the same direction, and thus causes the light to become incident on the equalizing device 32.

The equalizing device 32 equalizes the illuminance within a plane orthogonal to the center axis of the luminous flux emitted from the illumination device 31. The equalizing device 32 has a light control device 320, a UV filter 321, a first lens array 322, a cinema filter 323, a second lens array 324, a polarization conversion element 325, and a superimposing lens 326. Of these, the polarization conversion element 325 is configured to uniform the directions of polarization of incident light into one type and is one of the optical components in the invention.

The color separation device 33 separates the luminous flux incident from the equalizing device 32 into three color lights of red (R), green (G) and blue (B). The color separation device 33 has dichroic mirrors 331, 332, reflection mirrors 333 to 336, and a relay lens 337.

The electro-optical device 34 modulates the separated color lights according to image information and subsequently combines the modulated color lights. The electro-optical device 34 has liquid crystal panels 341 (liquid crystal panels for red, green and blue are denoted by 341R, 341G, 341B, respectively), field lenses 340, light incident-side polarizers 342 and light exiting-side polarizers 343, as light modulators provided for the respective color lights, and one color combining device 344. Of these, a dichroic prism can be employed as the color combining device 344. Also, each respective field lens 340 is arranged between the light incident-side polarizer 342 and the corresponding reflection mirror of the reflection mirrors 334 to 336.

The projection device 35 is a projection lens which projects the luminous flux combined by the color combining device 344 (luminous flux forming an image) on the projection surface in an enlarged form. As such a projection device 35, a lens set made up of a plurality of lenses arranged inside a lens barrel can be employed.

[Configuration of Cooling Device]

Figure 3:
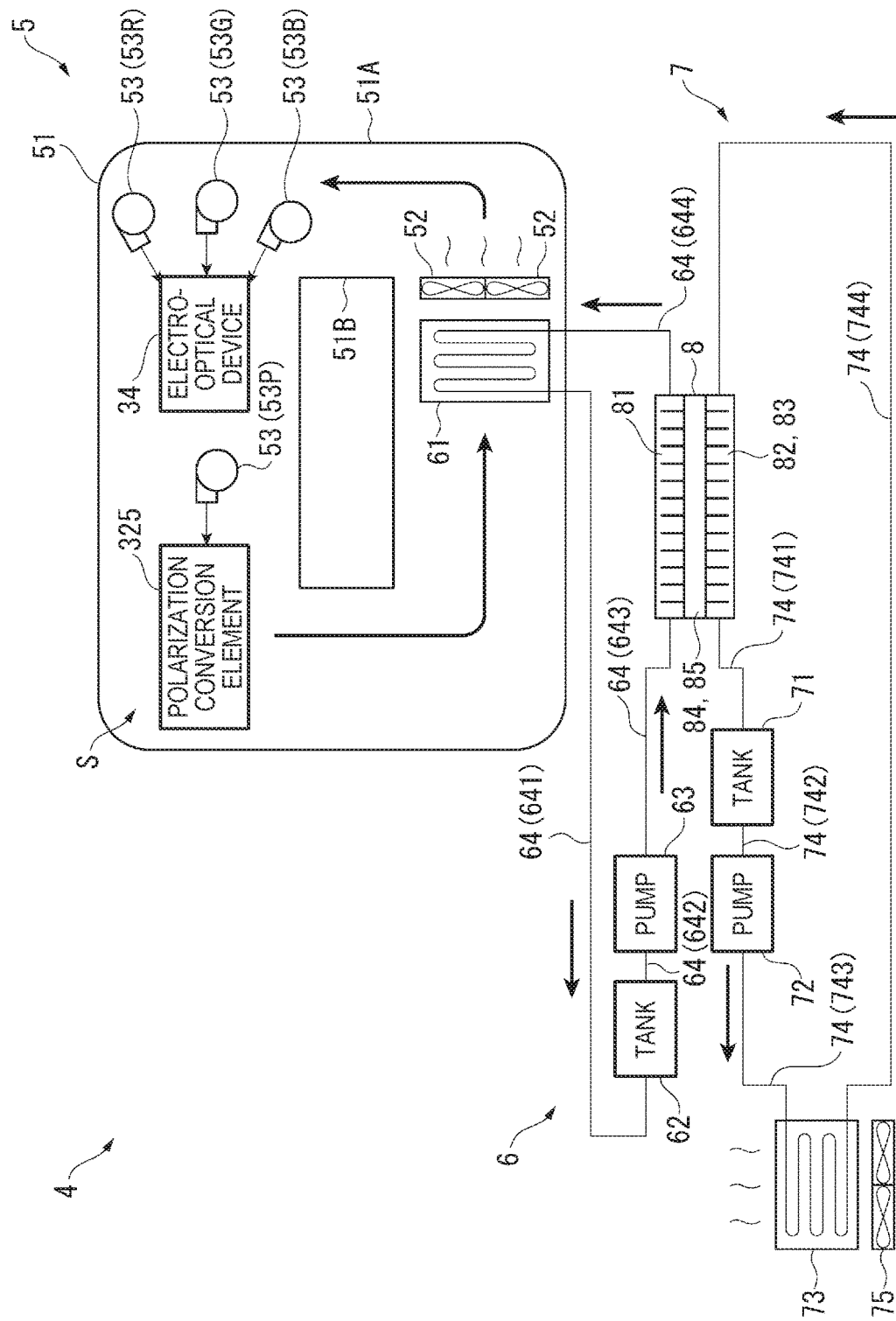
FIG. 3 is a block diagram showing a schematic configuration of a cooling device in the first embodiment.

FIG. 3 is a block diagram showing the schematic configuration of a cooling device 4.

The projector 1 has the cooling device 4 arranged inside the exterior casing 2, in addition to the foregoing configuration. This cooling device 4 is configured to cause cooling air (first fluid) in a sealed space S formed by a sealed casing 51 to circular and flow, thus cool a cooling target arranged inside the sealed space S, conduct the heat of the cooling air used for the cooling of the cooling target to a first liquid (second fluid) circulating through a circulation channel, cause the first liquid to flow out of the sealed casing 51, conduct the heat from the first liquid to a second liquid (third fluid) circulating through another circulation channel, and thus radiate the heat. The first liquid and the second liquid are names indicating that these are liquids circulating through different circulation channels from each other, and these liquids may be of the same components. As such liquids, water or an antifreeze such as propylene glycol can be given as an example.

This cooling device 4 has a circulating cooling device 5, a heat absorption device 6, a heat radiation device 7, and a heat exchanger 8, as shown in FIG. 3.

[Configuration of Circulating Cooling Device]

The circulating cooling device 5 is configured to circulate the cooling air in the sealed casing 51 and thus cool the cooling target arranged inside the sealed casing 51. The circulating cooling device 5 forms the first circulation channel of the invention. This circulating cooling device 5 has a circulation fan 52 and a cooling fan 53, in addition to the sealed casing 51.

The sealed casing 51 is a casing in which the electro-optical device 34 and the polarization conversion element 325, which are cooling targets, the circulation fan 52 and the cooling fan 53, and a heat absorber 61 forming the heat absorption device 6, described later, are accommodated. The sealed casing 51 forms the sealed space S where these are arranged. The sealed casing 51 is formed as a sealed structure which the air outside the sealed casing 51 cannot easily flow into.

The sealed casing 51 has an outer wall section 51A forming the outer edge of the sealed casing 51 and an inner wall section 51B forming the inner surface. With the outer wall section 51A and the inner wall section 51B combined with each other, an annular circulation channel is formed inside the sealed casing 51. The cooling targets are arranged in this circulation channel. Also, the sealed casing 51 has at least one opening for accommodating a field lens 340. In other words, at least one of the field lenses 340 forms a part of the sealed casing 51 with the optical component casing 36. In this embodiment, in this circulation channel, the electro-optical device 34 is situated upstream and the polarization conversion element 325 is situated downstream.

The circulation fan 52 sucks and ejects the cooling air in the sealed casing 51 and thus circulates the cooling air in the sealed casing 51. The circulation fan 52 in this embodiment is formed by an axial fan and two circulation fans are provided near the heat absorber 61, described later. However, the circulation fan 52 is not limited to this and may be formed by a Sirocco fan. The number of the circulation fans 52 can be suitably changed as well. Moreover, the circulation fans 52 may be arranged dispersedly.

The cooling fan 53 sucks the cooling air in the sealed casing 51 and sends the cooling air to the cooling targets via a duct (not illustrated). The cooling fan 53 is provided corresponding to each liquid crystal panel 341 of the electro-optical device 34 and includes cooling fans 53R, 53G, 53B which send the cooling air to the respective liquid crystal panels 341, and a cooling fan 53P which sends the cooling air to the polarization conversion element 325. The cooling fan 53 in this embodiment is formed by a Sirocco fan. However, the cooling fan 53 may be formed by an axial fan and the number of the cooling fans 53 can be suitably changed as well.

[Configuration of Heat Absorption Device]

The heat absorption device 6 is configured to absorb heat from the cooling air in the sealed casing 51 and cause the first liquid (second fluid) with the heat conducted thereto to flow to the heat exchanger 8 situated outside the sealed casing 51. The heat absorption device 6 forms the second circulation channel of the invention. The heat absorption device 6 has a heat absorber 61, a tank 62, a pump 63, and a plurality of flow tubes 64.

Of these, the flow tubes 64 (641 to 644) are equivalent to the second circulation channel-side flow tubes of the invention and connect the heat absorber 61, the tank 62 and the pump 63 to the heat exchanger 8, described later, in such a way that the first liquid can flow inside.

The heat absorber 61 is arranged inside the sealed casing 51. The tank 62 and the pump 63 are arranged outside the sealed casing 51.

Of these, the heat absorber 61 is connected to the tank 62 via the flow tube 641 and also connected to the heat exchanger 8 via the flow tube 644. The heat absorber 61 absorbs heat from the cooling air circulating in the sealed casing 51, thus cools the cooling air, and conducts the absorbed heat to the first liquid flowing inside. The first liquid heated by the heat absorber 61 flows toward the tank 62 via the flow tube 641.

The tank 62 is equivalent to the second circulation channel-side tank of the invention and is connected to the pump 63 via the flow tube 642. The tank 62 temporarily stores the first liquid circulating through the flow tubes 641 to 644. Thus, the first liquid with air and impurities mixed therein is retrained from flowing into the pump 63.

The pump 63 is equivalent to the second circulation channel-side pump of the invention and pumps the first liquid flowing therein via the flow tube 642 to the heat exchanger 8 via the flow tube 643.

Then, the first liquid flowing to the heat exchanger 8 is cooled by the heat exchanger 8 and flows again to the heat absorber 61 via the flow tube 644. Thus, the first liquid with a low temperature flows to the heat absorber 61, and the first liquid heated by the heat absorbed by the heat absorber 61 from the cooling air in the sealed casing 51 flows into the tank 62 from the heat absorber 61 via the flow tube 641. In this way, in the heat absorption device 6, the first liquid is circulated as the pump 63 is driven.

The configuration of the heat exchanger 8 will be described in detail later.

[Configuration of Heat Radiation Device]

The heat radiation device 7 is configured to circulate the second liquid (third fluid) to which the heat received from the first liquid is conducted by the heat exchanger 8, and thus radiate the heat of the second liquid. The heat radiation device 7 forms the third circulation channel of the invention. The heat radiation device 7 is arranged outside the sealed casing 51 and has a tank 71, a pump 72, a heat radiator 73, a flow tube 74, and a cooling fan 75.

Of these, the flow tube 74 (741 to 744) is equivalent to the third circulation channel-side flow tube of the invention and connects the tank 71, the pump 72 and the heat radiator 73 to the heat exchanger 8 in such a way that the second liquid can flow inside.

The tank 71 is equivalent to the third circulation channel-side tank of the invention and temporarily stores the second liquid circulating through the heat radiation device 7, similarly to the tank 62. The tank 71 is connected to the heat exchanger 8 via the flow tube 741 and is connected to the pump 72 via the flow tube 742.

The pump 72 is equivalent to the third circulation channel-side pump of the invention and pumps the second liquid flowing therein via the flow tube 742 to the heat radiator 73 via the flow tube 743.

The heat radiator 73 is a heat radiator which radiates the heat of the second liquid flowing inside and thus cools the second liquid. The second liquid cooled by the heat radiator 73 is made to flow to the heat exchanger 8 via the flow tube 744.

In the heat radiation device 7 formed in this way, when the pump 72 is driven, the second liquid circulated through the pump 72, the heat radiator 73, the heat exchanger 8 and the tank 71 connected to each other by the flow tube 74. Thus, the heat conducted to the second liquid by the heat exchanger 8 is radiated by the heat radiator 73.

The air outside the exterior casing 2 introduced through the inlet port (not illustrated) in the lateral surface section 26 is made to flow to the heat radiator 73 by the cooling fan 75. The heat radiator 73 is thus cooled. Then, the air heated by being used for the cooling of the heat radiator 73 is discharged out of the exterior casing 2 via the discharge port (not illustrated) formed in the lateral surface section 25.

[Configuration of Heat Exchanger]

Figure 4:
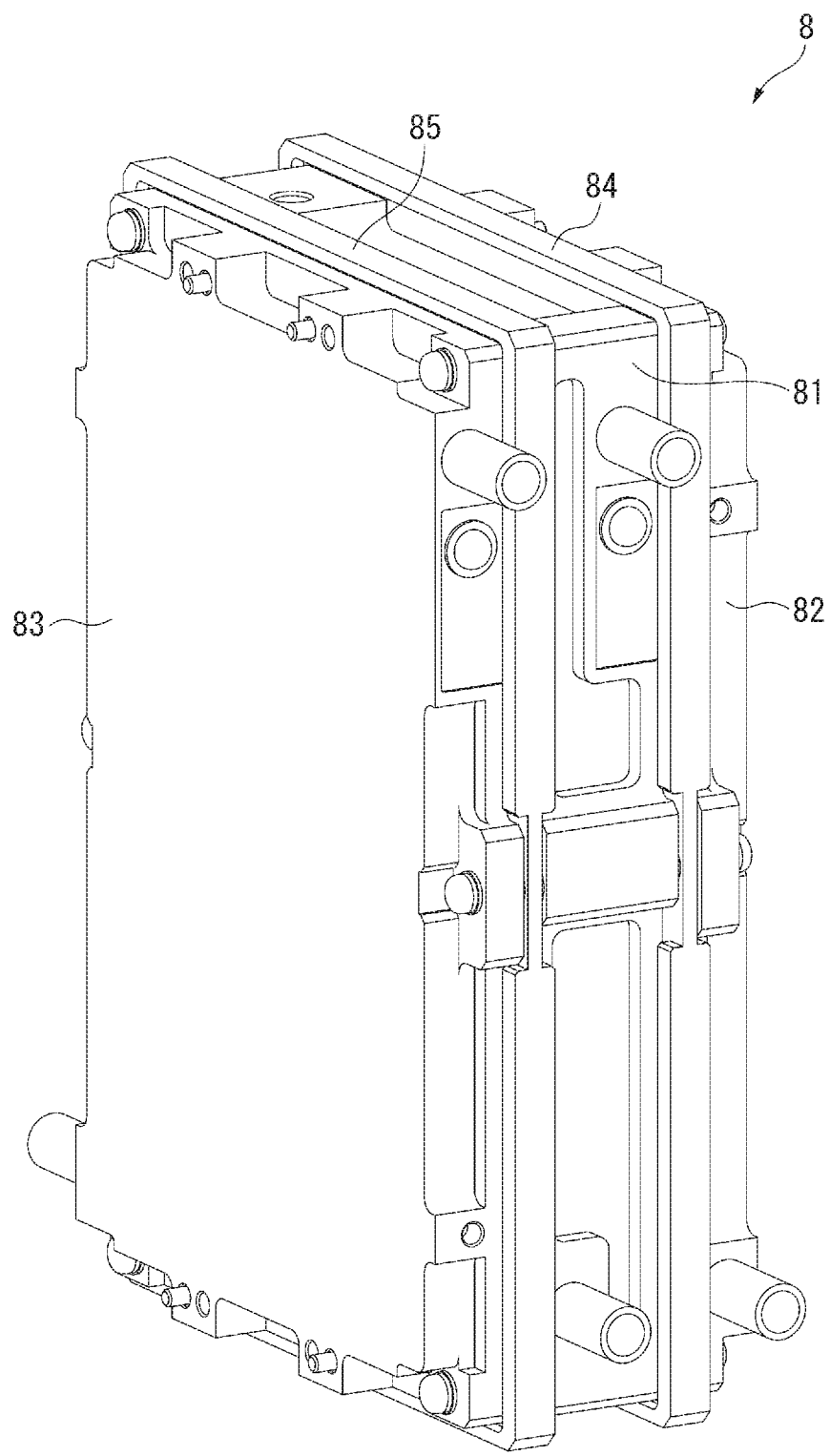
FIG. 4 is a perspective view showing a heat exchanger in the first embodiment.
Figure 5:
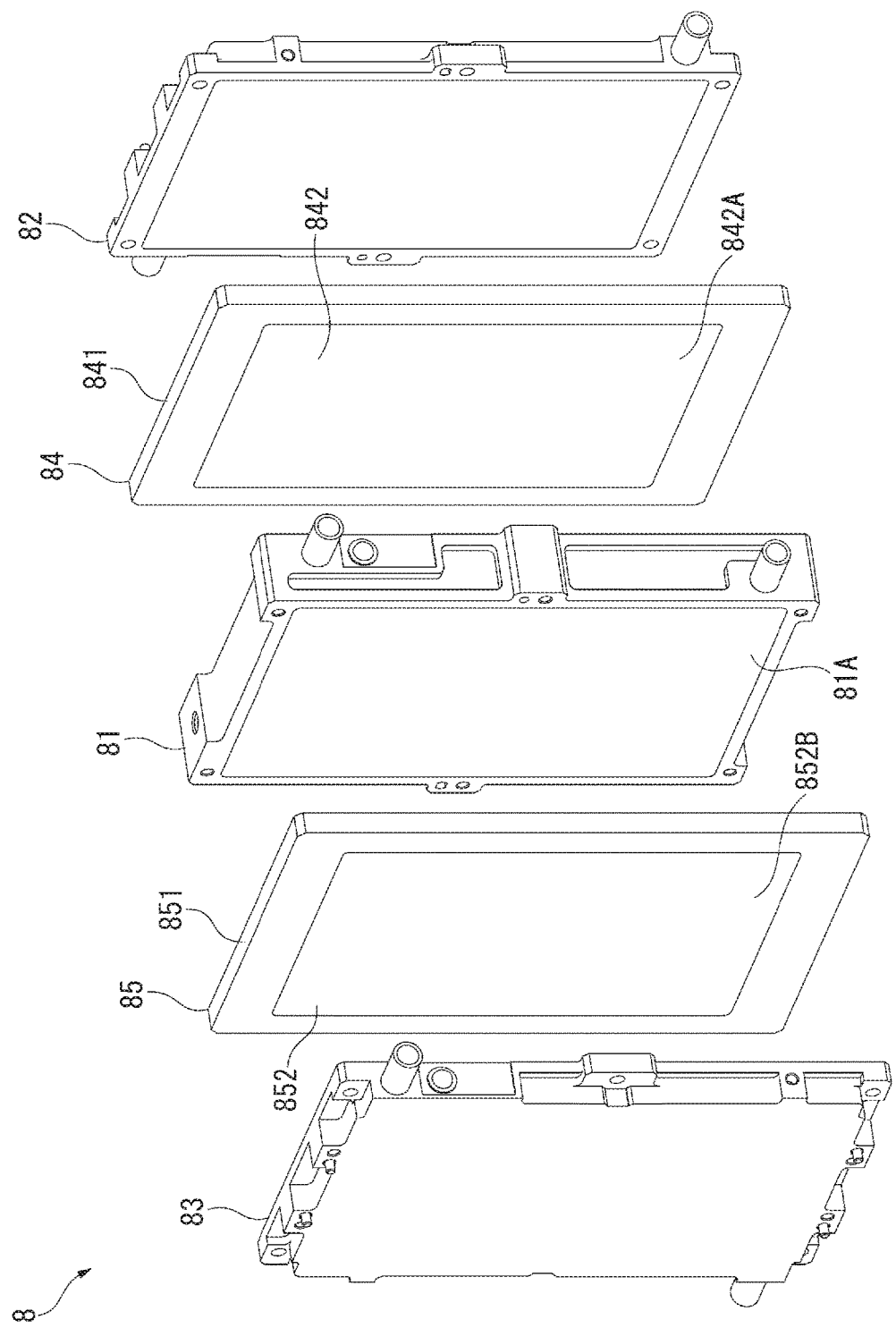
FIG. 5 is an exploded perspective view showing the heat exchanger in the first embodiment.
Figure 6:
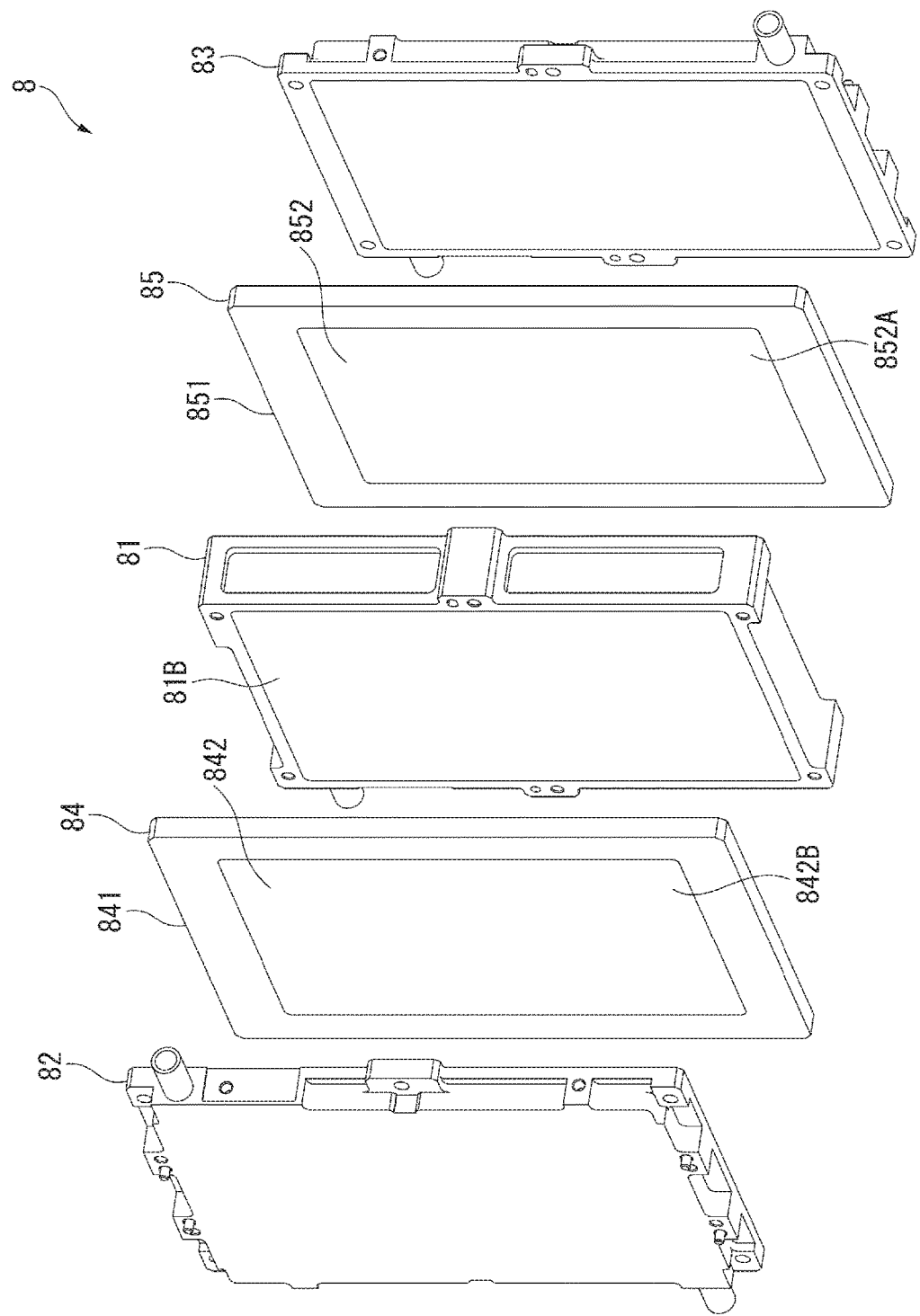
FIG. 6 is an exploded perspective view showing the heat exchanger in the first embodiment.

FIG. 4 is a perspective view showing the configuration of the heat exchanger 8. FIG. 5 and FIG. 6 are exploded perspective views showing the configuration of the heat exchanger 8. Also, FIG. 5 is an exploded perspective view of the heat exchanger 8, as viewed from one end side. FIG. 6 is an exploded perspective view, as viewed from the other end side.

The heat exchanger 8 receives heat from the first liquid circulating through the heat absorption device 6, that is, the first liquid to which the heat of the cooling air in the sealed casing 51 is conducted, then conducts the received heat to the second liquid circulating through the heat radiation device 7, and exchanges the heat between the first liquid and the second liquid, as described above. The heat exchanger 8 has a heat receiving section 81 in which the first liquid flows, two heat radiation sections 82, 83 sandwiching the heat receiving section 81, and two heat conducting sections 84, 85, as shown in FIGS. 4 to 6.

The heat receiving section 81 is configured to receive heat from the first liquid in the process of circulation therein of the first liquid flowing from the pump 63 via the flow tube 643. In the heat receiving section 81, a plurality of micro channels is formed by a plurality of thermally conductive fins within its internal space, though not illustrated, and the heat received in the process of the first liquid passing through the micro channels is conducted to a plate-like member 81A (FIG. 5) and a plate-like member 81B (FIG. 6) opposite each other in the heat receiving section 81. The first liquid, having its heat received and being cooled by such a heat receiving section 81, flows to the heat absorber 61 via the flow tube 644.

The two heat conducting sections 84, 85 are arranged respectively at positions sandwiching the heat receiving section 81.

The heat conducting section 84 has a casing 841 (support member) and a thermoelectric conversion element 842 supported by the casing 841.

The thermoelectric conversion element 842 is a Peltier element and has a heat absorption surface 842A arranged facing the side of the heat receiving section 81 and a heat radiation surface 842B facing the side of the heat radiation section 82. Also, the heat conducting section 84 is arranged between the heat receiving section 81 and the heat radiation section 82 in the state where the heat absorption surface 842A of the thermoelectric conversion element 842 is connected to the plate-like member 81B in a thermally conductive manner and where the heat radiation surface 842B is connected to the heat radiation section 82 in a thermally conductive manner. The thermoelectric conversion element 842 absorbs the heat conducted to the heat receiving section 81 from the first liquid and conducts the heat to the heat radiation section 82.

The heat conducting section 85 is configured similarly to the heat conducting section 84 and has a casing 851 (support member) and a thermoelectric conversion element 852 supported by the casing 851. The thermoelectric conversion element 852 is a Peltier element.

Such a heat conducting section 85 is arranged between the heat receiving section 81 and the heat radiation section 83 in the state where a heat absorption surface 852A of the thermoelectric conversion element 852 is connected to the plate-like member 81A in a thermally conductive manner and where a heat radiation surface 852B is connected to the heat radiation section 83 in a thermally conductive manner. The thermoelectric conversion element 852 absorbs the heat conducted to the heat receiving section 81 from the first liquid and conducts the heat to the heat radiation section 83.

The thermoelectric conversion elements 842, 852 have their operations controlled by having an applied voltage set by the control device. In this case, the control device controls the thermal conduction state of the thermoelectric conversion elements 842, 852, based on the temperatures inside and outside the sealed casing 51, for example, in such a way that the temperature inside the sealed casing 51 falls within a predetermined range of the temperature outside the sealed casing 51. Thus, water condensation inside the sealed casing 51 due to excessive cooling inside of the sealed casing 51 or the like is restrained.

The second liquid flows inside each of the heat radiation sections 82, 83. Of these heat radiation sections 82, 83, the heat radiation section 82 situated on the side of the heat conducting section 84 as viewed from the heat receiving section 81 is connected to the flow tube 744, and the second liquid cooled by the heat radiator 73 flows therein. Also, the heat radiation section 82 is connected to the heat radiation section 83 situated on the other side of the heat receiving section 81 in such away as to enable the second liquid to flow through. The heat radiation section 83 is connected to the tank 71 via the flow tube 741. That is, the heat radiation section 82 and the heat radiation section 83 are connected in series in the circulation channel of the second liquid. The heat radiation section 82 is situated upstream and the heat radiation section 83 is situated downstream.

Inside these heat radiation sections 82, 83, where the second liquid flows, a plurality of micro channels similar to those described above is formed, though not illustrated. In the process of the second liquid flowing through the plurality of micro channels, the heat conducted to the heat radiation sections 82, 83 is conducted to the second liquid.

[Thermal Conduction Path by Cooling Device]

In the cooling device 4 having the foregoing configuration, the cooling targets (polarization conversion element 325 and electro-optical device 34) arranged inside the sealed casing 51 forming the circulating cooling device 5 are cooled by the cooling air (first fluid) circulated by the circulation fan 52 and sent by the cooling fan 53, as shown in FIG. 3. The heat of the cooling air used for the cooling of the cooling targets is absorbed by the heat absorber 61 arranged inside the sealed casing 51, and the cooling air is cooled.

In the heat absorption device 6 including the heat absorber 61, the first liquid (second fluid) circulates as the pump 63 is driven. Thus, the first liquid heated by the heat absorber 61 flows into the heat receiving section 81 of the heat exchanger 8 via the tank 62 and the pump 63. As the first liquid flows inside the heat receiving section 81, the heat of the first liquid is conducted to the heat receiving section 81. Thus, the first liquid is cooled and sent again to the heat absorber 61 via the flow tube 644.

The heat conducted to the heat receiving section 81 is conducted to the heat radiation sections 82, 83 by the thermoelectric conversion elements 842, 852 of the heat conducting sections 84, 85. The second liquid (third fluid) circulating through the heat radiation device 7 flows into these heat radiation sections 82, 83. As the second liquid flows inside these heat radiation sections 82, 83, the heat received by the heat receiving section 81 is conducted to the second liquid.

This second liquid flows to the heat radiator 73 via the tank 71 and the pump 72. In the process of flowing inside the heat radiator 73, the heat of the second liquid is radiated. The cooled second liquid is sent again to the heat radiation sections 82, 83.

As described above, the cooling air from the cooling fan 75 flows to the heat radiator 73. Thus, the heat radiator 73 is cooled.

The projector 1 according to the embodiment described above has the following effects.

The first liquid to which heat is conducted from the cooling air circulating through the circulation channel inside the sealed space S flows through the circulation channel formed inside and outside the sealed space S by the heat absorption device 6. The heat of the first liquid is conducted and radiated to the second liquid flowing through the circulation channel formed outside the sealed space S by the heat radiation device 7. Thus, since the absorber 61 of the heat absorption device 6 is situated inside the sealed space S, heat can be conducted to the first liquid from the cooling air in the sealed space S. Moreover, the heat of the first liquid can be conducted and radiated to the second liquid outside the sealed casing 51. Therefore, compared with a configuration in which a large heat pipe is arranged to communicate the inside and outside of the sealed space S, the heat of the cooling air in the sealed space S can be conducted effectively to the second liquid via the first liquid and the cooling target in the sealed space S can be cooled effectively.

Also, since a part of the configuration of the heat absorption device 6 and the heat radiation device 7 are arranged spaced apart from the sealed space S (sealed casing 51), the degree of freedom in the installation of these configurations in the projector 1 (exterior casing 2) can be improved. Therefore, compared with a configuration in which a large heat pipe must be arranged near the sealed casing 51, the degree of freedom in the arrangement of each configuration can be improved.

In the heat exchanger 8, the thermoelectric conversion elements 842, 852 absorb the heat of the first liquid received by the heat receiving section 81 and conduct the heat to the heat radiation sections 82, 83 through which the second liquid flows. Therefore, the heat can be conducted efficiently between the first liquid and the second liquid. Thus, since the first liquid can be cooled, the cooling air in the sealed space S can be cooled and the cooling target can be cooled effectively.

As the pump 63 is driven, the first liquid cooled at the heat exchanger 8 flows to the heat absorber 61 via the flow tube 64 (644). Thus, the first liquid with the lowest temperature in the circulation channel of the heat absorption device 6 can be made to flow to the heat absorber 61 inside the sealed casing 51. Therefore, since the cooling of the cooling air through the heat exchange by the heat absorber 61 can be carried out effectively, the cooling air with a low temperature can be made to flow to the cooling target, and the cooling target can be cooled effectively.

As the pump 72 is driven, the second liquid having its heat radiated by the heat radiator 73 is made to flow to the heat exchanger 8 via the flow tube 74 (744). Thus, the second liquid with the lowest temperature in the circulation channel of the heat radiation device 7 can be made to flow to the heat exchanger 8. Therefore, it can be made easier to conduct heat from the first liquid to the second liquid, and the first liquid can be cooled more effectively. Therefore, the cooling air in the sealed space S and hence the cooling target can be cooled more effectively.

The circulation fan 52 is provided inside the sealed casing 51. The cooling air in the sealed casing 51 can be securely circulated by driving the circulation fan 52. Therefore, the cooling air can be securely circulated to the cooling target in the sealed space S, and the cooling target can be cooled securely.

At least one of the field lenses 340 forms the sealed space S along with the sealed casing 51 and the optical component casing 36. Therefore, a member separating the space (sealed space S) inside the sealed casing 51 and the space inside the optical component casing 36 can be omitted. Thus, the number of components can be reduced and the sealed casing 51 and hence the projector 1 can be reduced in size.

The cooling target is the electro-optical device 34 including the liquid crystal panel 341 as a light modulator, and the polarization conversion element 325 as an optical component. Therefore, since these cooling targets can be cooled effectively, image projection can be carried out stably, and deterioration of the cooling targets and deterioration of projection images can be restrained.

Modification of First Embodiment

Figure 7:
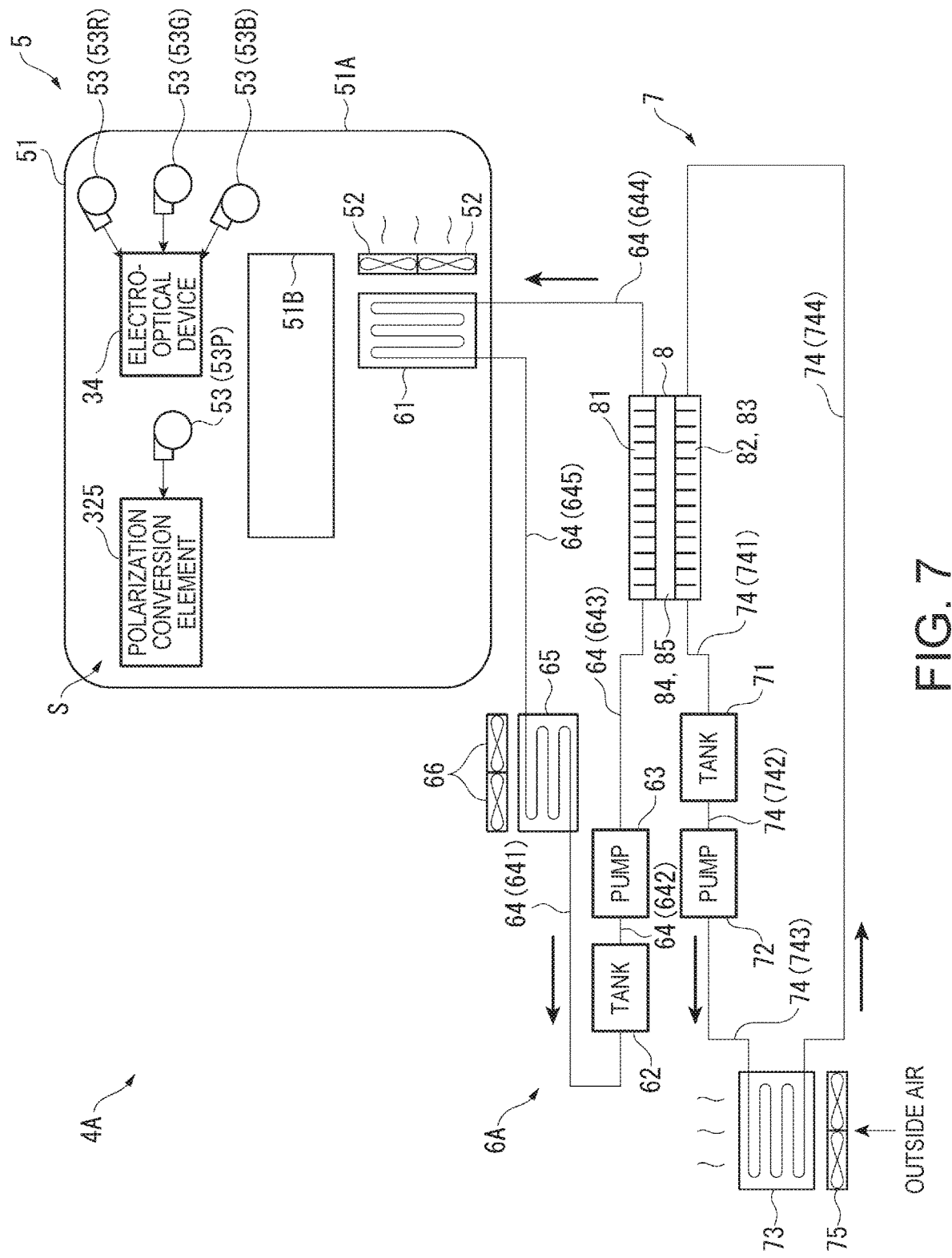
FIG. 7 is a block diagram showing a modification of the cooling device in the first embodiment.

FIG. 7 is a block diagram showing the configuration of a cooling device 4A which is a modification of the cooling device 4.

In the cooling device 4, the heat absorption device 6 is configured in such a way that the first liquid to which heat is conducted from the cooling air in the sealed space S by the heat absorber 61 is circulated and that the first liquid has its heat absorbed and is cooled when passing through the heat exchanger 8. However, the configuration of the heat absorption device is not limited to the foregoing configuration. The heat absorption device may further include a configuration for cooling the first liquid.

For example, a heat absorption device 6A shown in FIG. 7 further include a heat radiator 65 and a cooling fan 66 in addition to the configuration of the heat absorption device 6, and the heat radiator 65 is arranged between the heat absorber 61 and the tank 62. That is, the heat radiator 65 is arranged downstream of the heat absorber 61 and upstream of the tank 62 in the circulation channel of the cooling liquid in the heat absorption device 6A.

This heat radiator 65 is equivalent to the second circulation channel-side heat radiator of the invention, and is a radiator which radiates the heat of the first liquid in the process of the first liquid flowing inside, similarly to the heat radiator 73.

Also, the heat radiator 65 radiates the heat of the first liquid flowing therein from the heat absorber 61 via the flow tube 64 (645) and thus cools the first liquid, and causes the cooled first liquid to flow to the tank 62 via the flow tube 64 (641). The cooling air introduced into the exterior casing 2 by the cooling fan 66 flows to the heat radiator 65, and the heat radiator 65 is thus cooled.

The cooling device 4A thus having the heat absorption device 6A instead of the heat absorption device 6 and a projector having the cooling device 4A instead of the cooling device 4 can achieve effects similar to those of the cooling device 4 and the projector 1 and can also achieve the following effects.

Since the first liquid circulating through the heat absorption device 6A can be cooled by the heat radiator 65, the temperature of the first liquid can be lowered further. Thus, the cooling air inside the sealed space S can be cooled more effectively by the heat absorber 61 and therefore the cooling target can be cooled more effectively.

Second Embodiment

Next, a second embodiment of the invention will be described.

A projector according to this embodiment has a configuration similar to that of the projector 1 but is different from the projector 1 in that the sealed casing is further provided with another thermal conduction path (heat radiation path). In the description below, the same parts or substantially the same parts as those already described are denoted by the same reference numbers and the description thereof is omitted.

Figure 8:
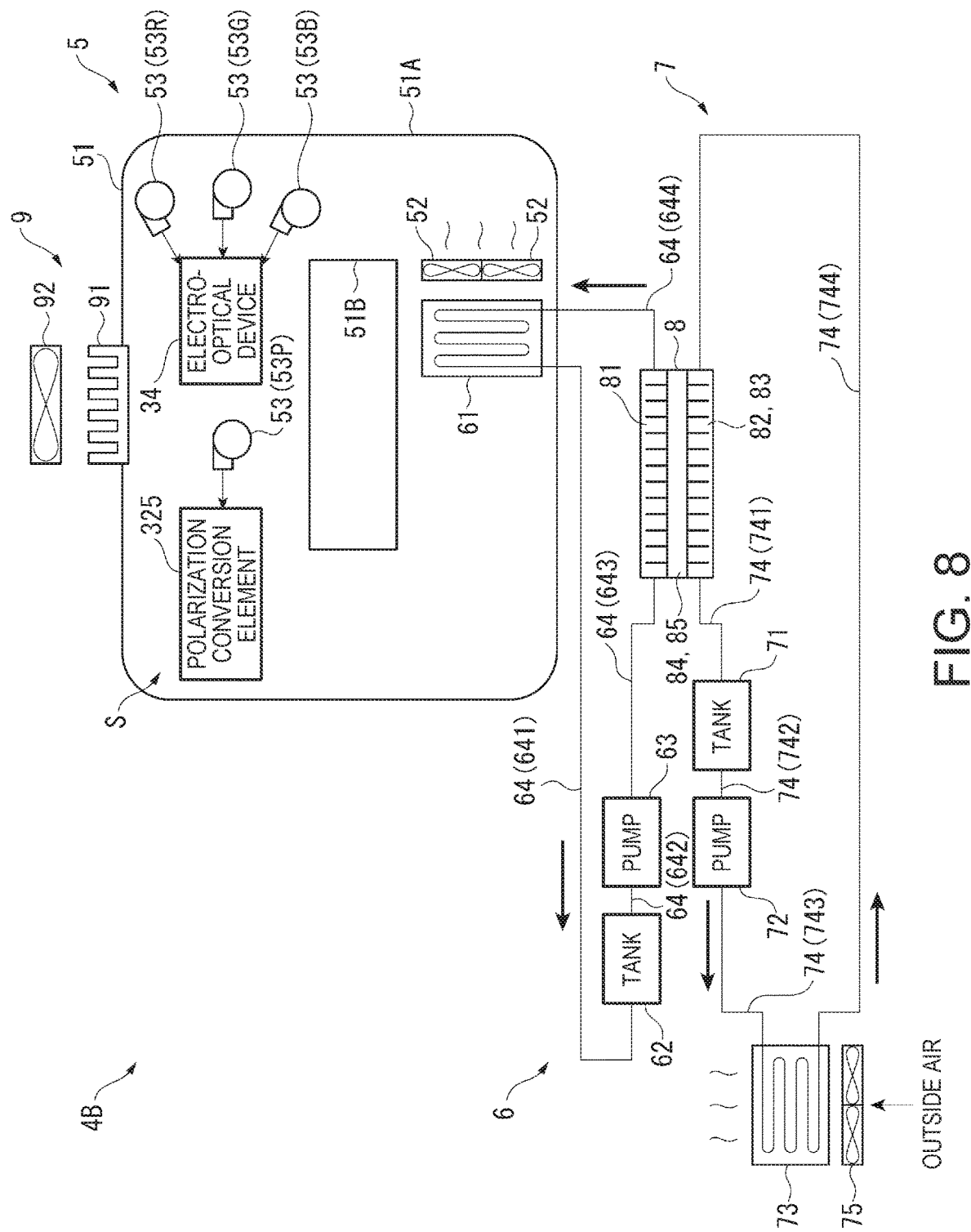
FIG. 8 is a block diagram showing a configuration of a cooling device provided in a projector according to a second embodiment of the invention.

FIG. 8 is a block diagram showing the configuration of a cooling device 4B provided in the projector according to this embodiment.

The projector according to this embodiment has a configuration and functions similar those of the projector 1, except having the cooling device 4B instead of the cooling device 4. Also, the cooling device 4B has a configuration and functions similar to those of the cooling device 4, except further having a sealed space cooling device 9, as shown in FIG. 8.

The sealed space cooling device 9 cools the cooling air circulated inside the sealed space S, through a different path from the combination of the heat absorption device 6, the heat radiation device 7 and the heat exchanger 8 (that is, a different path from the second circulation channel and the third circulation channel). This sealed space cooling device 9 has a heat radiation member 91 penetrating an outer wall section 51A of the sealed casing 51, and a cooling fan 92 which causes the cooling air to flow to the heat radiation member 91.

The heat radiation member 91 is formed by a so-called heat sink and fitted in an opening (not illustrated) formed in the outer wall section 51A. Therefore, a part of the heat radiation member 91 is situated inside the sealed casing 51 and its other part is situated outside the sealed casing 51. Such a heat radiation member 91 is arranged to be situated downstream of the cooling target and upstream of the heat absorber 61, in the circulation channel of the cooling air inside the sealed casing 51. In this embodiment, the cooling target is the electro-optical device 34 and the polarization conversion element 325 and these are arranged spaced apart from each other. Therefore, the heat radiation member 91 is arranged between the electro-optical device 34 and the polarization conversion element 325 in the circulation channel of the cooling air.

Also, since the cooling air inside the sealed casing 51 flows along the site of the heat radiation member 91 situated inside the sealed casing 51, the heat of the cooling air is conducted to the heat radiation member 91 and the cooling air is thus cooled. Also, the heat radiation member 91 thus heated is cooled by the cooling air that is made to flow outside the sealed casing 51 by the cooling fan 92.

The projector according to this embodiment described above can achieve effects similar to those of the projector 1 and can also achieve the following effects.

The sealed casing 51 is provided with the heat radiation member 91 radiating internal heat to outside, and the cooling air is made to flow to the heat radiation member 91 by the cooling fan 92. Thus, a path for lowering the temperature of the cooling air inside the sealed space S can be provided separately from the circulation channel of the heat absorption device 6 and the circulation channel of the heat radiation device 7. Therefore, the temperature of the cooling air can be lowered further and the cooling target inside the sealed casing 51 can be cooled effectively.

While the cooling device 4B employs the heat absorption device 6, it may also employ the heat absorption device 6A.

Modification of Second Embodiment

In the cooling device 4B, the cooling air inside the sealed casing 51 is cooled in a different path from the circulation channel of the heat absorption device 6 and the circulation channel of the heat radiation device 7, by the sealed space cooling device 9 having the heat radiation member 91 attached to the sealed casing 51 and the cooling fan 92. However, the configuration of the sealed space cooling device 9 is not limited to the foregoing configuration and may be other configurations.

For example, a configuration may be employed in which at least part of the sealed casing 51 (for example, at least a part of the outer wall section 51A) is formed of a thermally conductive material and in which the cooling fan 92 causes the cooling air to flow to the thermally conductive site formed of the thermally conductive material. With such a configuration, too, heat can be exchanged inside and outside the sealed casing 51 via the thermally conductive site.

Therefore, the cooling air circulating inside the sealed casing 51 can be cooled and hence the cooling target can be cooled efficiently.

Modifications of Embodiments

The invention is not limited to the foregoing embodiments. Modifications, improvements and the like within a range that can achieve the object of the invention are included in the invention.

In the foregoing embodiments, the projector has the circulation channel of the cooling air inside the sealed space S (first circulation channel of the first fluid), the circulation channel of the first liquid in the heat absorption device 6 (second circulation channel of the second fluid), and the circulation channel of the second liquid in the heat radiation device 7 (third circulation channel of the third fluid). The configurations of these circulation channels are not limited to those described above. For example, the configurations of the heat absorption device 6 and the heat radiation device 7 are not limited to those described above and may be any circulation channel having a configuration in which heat is conducted from the first fluid (gas) circulating inside the sealed space S to the second fluid of a liquid and in which the heat is further conducted to the third fluid of a liquid flowing through a different circulation channel from the second fluid.

In the foregoing embodiments, the heat exchanger 8 has a configuration in which the two heat radiation sections 82, 83 sandwich the heat receiving section 81 and in which the heat conducting sections 84, 85 having the thermoelectric conversion elements 842, 852 are arranged between the heat receiving section 81 and the heat radiation section 82 and between the heat receiving section 81 and the heat radiation section 83. However, the invention is not limited to this. For example, the heat exchanger may have a configuration including one heat receiving section, one heat radiation section, and a heat conducting section (thermoelectric conversion element) arranged between the heat receiving section and the heat radiation section. Also, the thermoelectric conversion element may be absent, or a plurality of thermoelectric conversion elements may be provided. That is, other configurations may be employed as the configuration of the heat exchanger.

In the foregoing embodiments, the circulating cooling device 5 circulates the cooling air inside the sealed space S and thus cools the cooling target arranged inside the sealed space S. However, the invention is not limited to this. For example, the sealed space S may be filled with a gas (nitrogen gas, helium gas or the like) that is different from air, and this gas may be circulated to cool the cooling target.

In the foregoing embodiments, the heat exchanger 8 is situated upstream and very near the heat absorber 61 in the circulation channel of the first liquid, and the first liquid cooled by the heat receiving section 81 of the heat exchanger 8 flows to the heat absorber 61 via the flow tube 644. However, the invention is not limited to this. For example, between the heat exchanger 8 and the heat absorber 61, the tank 62 and the pump 63 may be arranged and the heat radiator 65 may be arranged as well. That is, the heat absorption device 6 may have a configuration in which the first liquid flowing out of the heat exchanger 8 is sent to the heat absorber 61 via another configuration.

In the foregoing embodiments, the heat exchanger 8 is situated downstream and very near the heat radiator 73 in the circulation channel of the second liquid, and the second liquid cooled by the heat radiator 73 flows to the heat radiation section 82 of the heat exchanger 8 via the flow tube 744. However, the invention is not limited to this. For example, between the heat radiator 73 and the heat exchanger 8, the tank 71 and the pump 72 may be arranged. That is, the heat radiation device 7 may have a configuration in which the second liquid flowing out of the heat radiator 73 is sent to the heat exchanger 8 via another configuration.

In the foregoing embodiments, the circulating cooling device 5 is arranged inside the sealed casing 51 and has the circulation fan 52 circulating the cooling air inside. The circulation fan 52 is arranged near the heat absorber 61. However, the invention is not limited to this. For example, the arrangement position of the circulation fan 52 need not necessarily be near the heat absorber 61, provided that the cooling air inside the sealed casing 51 can be circulated. Also, the circulation fan 52 may be absent, provided that the cooling air suction force of the cooling fan 53 is high so that the cooling air can be circulated by the cooling fan 53.

In the foregoing embodiments, the polarization conversion element 325 and the electro-optical device 34 are employed as the cooling target. However, the invention is not limited to this. For example, the cooling target may be only one of the polarization conversion element 325 and the electro-optical device 34. Also, as the cooling target, the light source may be employed and other optical components may be employed.

Also, in the foregoing embodiments, in the circulation channel of the cooling air, the electro-optical device 34 is arranged upstream near the heat absorber 61, and the polarization conversion element 325 is arranged downstream. However, this is not limiting. In this circulation channel, the arrangement may be reversed, or these components may be arranged in parallel. The same applies to the case where other cooling targets are employed.

In the foregoing embodiments, the projector 1 has the three liquid crystal panels 341 (341R, 341G, 341B). However, the invention is not limited to this. That is, the invention is also applicable to a projector using two or fewer, or four or more liquid crystal panels.

Also, the shape of the image forming device 3 is not limited to the foregoing shape. The image forming device 3 may employ a substantially L-shaped configuration as viewed in a plan view or a substantially U-shaped configuration as viewed in a plan view, and may also have other configurations.

Moreover, the liquid crystal panels 341 employed as the light modulator may be transmission-type or reflection-type. Alternatively, a light modulator other than liquid crystal such as a device using a micromirror, for example, a DMD (digital micromirror device) or the like, may be used.

In the foregoing embodiments, the illumination device 31 has a configuration having the two light sources 31A, 31B, each having the light source lamp 311 and the reflector 312. However, the invention is not limited to this. That is, the number of the light sources may be one, or three or more. Also, as the light source, a configuration having a solid state light source such as an LED (light emitting diode) or LD (laser diode) may be used. In this case, a configuration having a fluorescent body which emits fluorescent light, excited by excitation light emitted from the LD, may be employed.

The entire disclosure of Japanese Patent Application No. 2015-079498, filed Apr. 8, 2015 is expressly incorporated by reference herein.

What is claimed is:

1. A projector comprising:
   an exterior casing that forms an exterior of the projector;
   a sealed casing that is disposed in the exterior casing, and has a sealed space;
   a circulating cooling device that is configured to form a first circulation channel (i) formed in the sealed space and (ii) the first circulation channel circulates a first fluid for cooling a cooling target arranged within the sealed space;
   a heat absorption device that has a heat absorber to absorb heat from the first fluid in the first circulation channel, and that is configured to form a second circulation channel that circulates a second fluid that absorbs heat from the first fluid;
   a heat radiation device that is configured to form a third circulation channel where a third fluid to which heat is conducted from the second fluid circulates and where the heat conducted to the third fluid is radiated in a process of circulation of the third fluid; and
   a heat exchanger connected to the second circulation channel and the third circulation channel;
   wherein the heat exchanger includes a heat receiving section configured to receive heat from the second fluid, and a heat radiation section configured to radiate the heat conducted from the heat receiving section to the third fluid,
   wherein the first fluid is gas,
   wherein the second fluid and the third fluid are liquid, and
   wherein the first circulation channel, the second circulation channel, and the third circulation channel are disposed within the exterior casing.

2. The projector according to claim 1,
   wherein the heat exchanger includes:
      a thermoelectric conversion element which has a heat absorption surface connected to the heat receiving section in a thermally conductive manner and which has a heat radiation surface connected to the heat radiation section in a thermally conductive manner.

3. The projector according to claim 2,
   wherein the second circulation channel includes
      a second circulation channel-side pump configured to pump the second fluid,
      a second circulation channel-side tank configured to store the second fluid, and
      a plurality of second circulation channel-side flow tubes configured to connect the second circulation channel-side pump, the heat absorber, the second circulation channel-side tank and the heat exchanger, and
   wherein the second fluid pumped by the second circulation channel-side pump flows in order through the heat exchanger, the heat absorber and the second circulation channel-side tank, subsequently flows into the second circulation channel-side pump, and thus circulates through the second circulation channel.

4. The projector according to claim 3,
   wherein the second circulation channel includes a second circulation channel-side heat radiator configured to radiate the heat of the second fluid flowing inside.

5. The projector according to claim 2,
   wherein the third circulation channel includes
      a third circulation channel-side pump configured to pump the third fluid,
      a heat radiator configured to radiate the heat of the third fluid flowing inside,
      a third circulation channel-side tank configured to store the third fluid, and
      a plurality of third circulation channel-side flow tubes configured to connect the third circulation channel-side pump, the heat radiator, the third circulation channel-side tank, and the heat exchanger, and
   wherein the third fluid pumped by the third circulation channel-side pump flows in order through the heat radiator, the heat exchanger and the third circulation channel-side tank, subsequently flows into the third circulation channel-side pump, and thus circulates through the third circulation channel.

6. The projector according to claim 1, further comprising a circulation fan arranged inside the sealed space and configured to circulate the first fluid.

7. The projector according to claim 1, further comprising:
   a cooling fan disposed outside the sealed casing and configured to send cooling air,
      wherein the sealed casing includes a heat radiation member configured to radiate heat inside the sealed casing to outside, and
   wherein the cooling fan is configured to flow the cooling air to the heat radiation member.

8. The projector according to claim 1, further comprising:
   a light source;
   a light modulator configured to modulate light emitted from the light source and form an image; and
   an optical component arranged on an optical path of the light emitted from the light source and configured to contribute to image formation by the light modulator,
   wherein the optical component includes a field lens, and
   wherein the field lens and the sealed casing constitute the sealed space.

9. The projector according to claim 1, comprising:
   a light source;
   a light modulator configured to modulate light emitted from the light source and form an image; and
   an optical component arranged on an optical path of the light emitted from the light source and configured to contribute to image formation by the light modulator,
   wherein the cooling target is the light source, the light modulator and the optical component.

10. The projector according to claim 1, further comprising:
    a circulation fan disposed in the sealed casing; and
    at least one cooling fan disposed in the sealed casing and configured to send the first fluid to the cooling target.

11. The projector according to claim 1, wherein the third fluid is a liquid over the entire third circulation channel.

* * * * *